United States Patent [19]
Benn

[11] Patent Number: 4,634,491
[45] Date of Patent: Jan. 6, 1987

[54] PROCESS FOR PRODUCING A SINGLE CRYSTAL ARTICLE

[75] Inventor: Raymond C. Benn, Huntington, W. Va.

[73] Assignee: Inco Alloys International, Inc., Huntington, W. Va.

[21] Appl. No.: 747,225

[22] Filed: Jun. 21, 1985

[51] Int. Cl.⁴ .............................................. C30B 1/08
[52] U.S. Cl. .................................... 156/603; 156/620; 156/DIG. 65
[58] Field of Search .............. 156/603, 620, DIG. 65, 156/DIG. 100, DIG. 73, 617 R

[56] References Cited
U.S. PATENT DOCUMENTS 4,386,976  6/1983  Benn et al. .......................... 148/428
4,475,980  10/1984  Rhemmer et al. .................. 156/603
4,519,870  5/1985  Hatsuzawa .......................... 156/603

OTHER PUBLICATIONS

Aust, The Art and Science of Growing Crystals, Wiley & Sons, Gilman-Ed. 1963, pp. 452-454.

Primary Examiner—Hiram H. Bernstein
Attorney, Agent, or Firm—Francis J. Mulligan, Jr.; Raymond J. Kenny

[57] ABSTRACT

A process for producing a single crystal alloy object comprising providing a preform having coarse columnar crystals in a discard portion, isolating, by cutting, one of the columnar crystals to form a seed crystal connected to metal in a product portion of said preform, zone annealing the thus prepared preform to produce single crystal structure and discarding the discard portion of the preform.

5 Claims, 7 Drawing Figures

ISOLATED SINGLE CRYSTAL BRIDGE

PROCESS FOR PRODUCING A SINGLE CRYSTAL ARTICLE

The U.S. Government has been granted a fully paid up license under this patent in accordance with the Patents Rights Clause (Retention by the Contractor [Long Form]) included in Contract No. N62269-80-C-0297 with the Department of the Navy.

TECHNICAL FIELD

This invention relates to a process for producing single crystals of material which for one reason or another cannot or should not be placed in the molten state. It is particularly adaptable for producing single crystals of oxide dispersion hardened alloys.

BACKGROUND ART

It is known to produce single crystal metallic objects by casting. This is done in a mold which permits solidification to progress from one end of the mold toward the other end of the mold. At the part of the mold at which metal first solidifies there is a crystal selector structure which, by providing a tortuous path, causes metal which is freezing to become by competitive grain growth essentially single crystal metal by bending the freezing front around corners or around bends such as in a pigtail configuration. When the freezing front of metal enters the cavity proper of such a mold the metal is or should be freezing in the configuration of a single crystal. Thereafter, the freezing front is maintained in the principal cavity of the mold to produce single crystal objects such as turbine blades useful in the hot stages of gas turbine engines. U.S. Pat. No. 3,724,531 discloses such a method.

Such a method of producing single crystal casting is of no use when the alloy out of which the single crystal object is to be made is a metal which is hardened by a dispersion of a material which does not form a liquid phase in the molten alloy. To illustrate, it is known to produce hardened nickel base alloys by the production of a dispersed gamma prime phase formed by precipitation in the solid phase from the alloy matrix. Such gamma prime hardened alloys however, are uniform in the molten state. That is, the hardening phase, specifically $Ni_3Al$ or a variant thereof, dissolves either in the solid or the liquid gamma phase matrix of the nickel base alloy and thus the alloy is castable by normal methods. However, if the nickel base alloy is hardened by a material such as thorium oxide e.g., the alloy known as TD nickel, or is hardened by refractory oxides such as yttrium oxide or oxidic compounds thereof and perhaps also hardened by gamma prime phase for example, as in the alloy known as INCONEL alloy MA 6000, the oxidic hardening phase will not dissolve in molten alloy. If the alloy is molten to any significant extent at any stage in its manufacture, the oxidic phase will be separated by gravity effects and not be effective for the purpose of hardening the alloy.

Alloys such as MA 6000 and many variants and improvements thereof, are normally made by a method called mechanical alloying. In this process, powders of the alloying ingredients are subjected to vigorous mechanical working in the presence of the desired oxidic dispersant until a significant fraction of saturation hardness of the alloying ingredients is obtained as well as an intimate combination of oxidic and metallic ingredients. The powders produced by mechanical alloying are then treated using powder metallurgical techniques specifically adapted for mechanically alloyed products and at no time during the manufacture of a mechanically alloyed object or during the life time of that object is the material melted. As stated before, if significant molten phase is produced the oxidic dispersion imparting strength to the mechanically alloyed object will be destroyed.

Reference is made to the text "The Art and Science of Growing Crystals" J. J. Gilman, Editor, J. Wiley & Sons Inc., 1963 particularly to pages 453 and 454. In this text it is disclosed that a single crystal seed can be isolated in a metal bar by cutting and that this single crystal seed can be grown epitaxially by gradient annealing to provide a single crystal in the bar.

SUMMARY OF THE INVENTION

The invention has the objective of providing and comprises a process for producing a single crystal metallic object in which a metallic object preform having an object portion and a discard portion is provided. In the discard portion of the preform there is produced a coarsely columnar crystal structure which in the ordinary case is configured so as to have the longitudinal axes of the columnar crystals lying in a direction from the discard portion to the object portion. The thus configured preform is now cut in such a fashion so as to isolate a relatively centrally located one of the columnar crystals, of suitable crystallographic orientation, as the only metallic connection between the object portion of the preform and the discard portion. When making the cut, the angle of the cut should be at least about 135° measured with reference to the axis of that single columnar crystal and measured from the discard portion. Once the cut has been made the preform is thereafter zone annealed to grow the one columnar crystal isolated by the cut into the object portion of the preform.

The object portion of the preform is provided with a recrystallizable polycrystalline structure so that when the zone annealing takes place the single columnar crystal grows into the object portion of the preform at the expense of the crystals of said recrystallized polycrystalline structure. In this way, the object portion becomes a single crystal with the same controlled orientation as the seed. The zone annealing is characterized by imparting relative motion between the preform and a localized steep gradient thermal energy source which is controlled and modified so that for at least the first portion of the zone annealing the thermal energy source provides a higher annealing temperature centrally in the preform i.e., at or near the location of the growing single columnar crystal than at the exterior of the preform. Once the single columnar crystal has grown epitaxially through the object portion of the preform to provide therein a single crystal, the discard portion of the preform is then cut away and discarded (if not done previously) to leave the desired single crystal metallic object as produced by zone annealing.

BEST MODES FOR CARRYING OUT THE INVENTION

Figure 1:
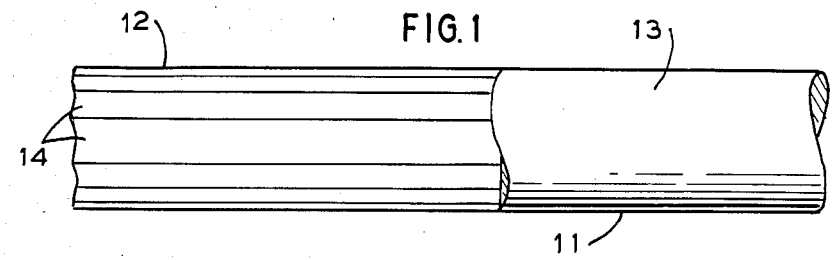
FIG. 1 is a view in section of a rod or bar preform employable in the process of the present invention.

The process of carrying out the present invention is described with particularity in reference to the drawings. Referring now thereto preform 11 shown in FIG. 1 is a bar having a discard portion 12 and an object portion 13. Preform 11 is particularly adapted to provide single crystal bar stock for production of aircraft gas turbine blades by first producing the bar stock and then machining the blades out of the bar stock. Those skilled in the art will appreciate that such a preform is generally at least as large as the largest cross-section of the turbine blade to be made therefrom. Those skilled in the art will also appreciate that preform 11 can be of any desired length and, if long enough, object portion 13 can be sliced to lengths after processing is complete to provide a multiplicity of single crystal articles.

Columnar crystals 14 are depicted as part of the structure of discard portion 12. These columnar crystals are generally made by zone annealing preform 11 as a bar in a normal manner such as disclosed in U.S. Pat. No. 4,386,976. Object portion 13 of preform 11 has a polycrystalline structure such as would be normally produced by mechanical alloying, compaction and extrusion or other thermomechanical treatment to provide a mechanically alloyed bar.

Figure 2:
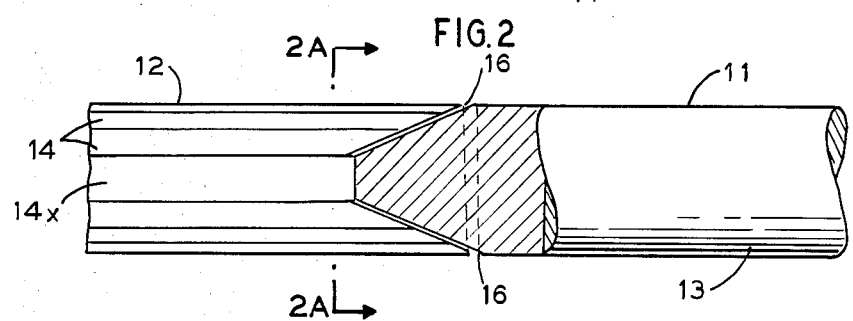
FIG. 2 shows a longitudinal section of a preform similar to that of FIG. 1 which has been cut in accordance with the process of the present invention.
Figure 2A:
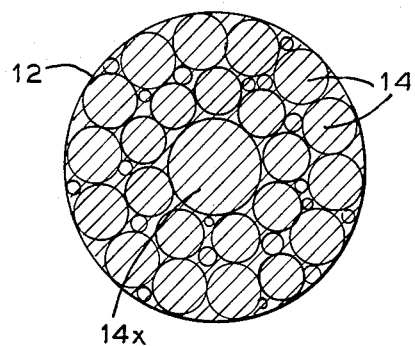
FIG. 2A shows a cross-sectional view of a cut preform.

Having provided the preform 11 as depicted in FIG. 1, the process now contemplates making a cut in that preform to isolate one of columnar crystals 14. Cut 16 is depicted in FIG. 2 and in FIG. 2A. In the type of nickel-base alloy which is oxide dispersion hardened, and gamma prime hardened, cut 16 is made by electrodischarge machining. Any other suitable cutting means can also be used. Cut 16 extends in a cone-like fashion from the surface of preform 11 into the interior of preform 11 and isolates single crystal 14X as shown in FIGS. 2 and 2A. It is important that only one single crystal be isolated by cut 16 because during subsequent zone annealing, epitaxial growth into object portion 13 must arise from only one crystal in order to provide a single crystal in object portion 14. If more than one columnar crystal provides a metallic bridge from discard portion 12 to object portion 13 of preform 11, more than one crystal will then grown into object portion 13 and the objective of the invention will not be obtained. It is preferred to select to bridging crystal 14X so as to have a preferred crystallographic orientation. For example, in gamma phase alloys hardened by gamma prime precipitate as well as by a dispersed oxidic phase, orientations along the longitudinal axis of the seed crystal 14X of 100 will provide single crystal objects of relatively low modulus in that direction. Contrarywise, orientations of 111 will provide relatively high modulus in that direction while 110 orientations will provide a normal or intermediate moldulus.

Figure 3:
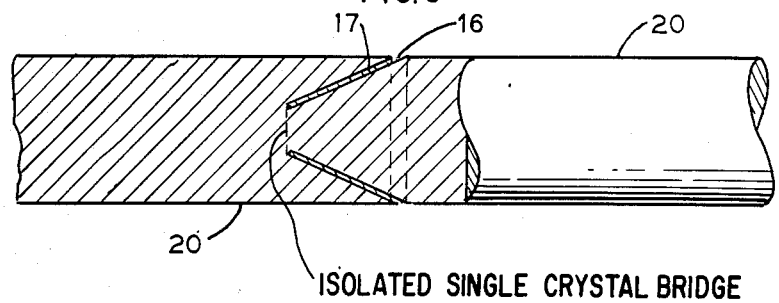
FIG. 3 shows in section one embodiment of the present invention wherein the cut is filled with a conductive material.

Referring now to FIG. 3, cut 16 is depicted as being filled with a metallic electro-conductive material 17. The purpose of this filling with a metallic conductive material 17, which must be solid at the temperature of zone annealing, is to permit the zone annealing to be done by use of a induction heating apparatus, the function of the filling being to minimize perturbation in the inducted electrical field.

Figure 4:
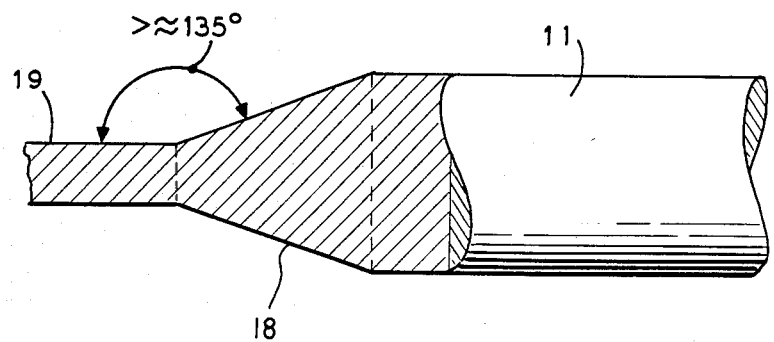
FIG. 4 shows in section a preform employable in an alternative embodiment of the present invention where the material which has been cut has been excised from the preform.
Figure 5:
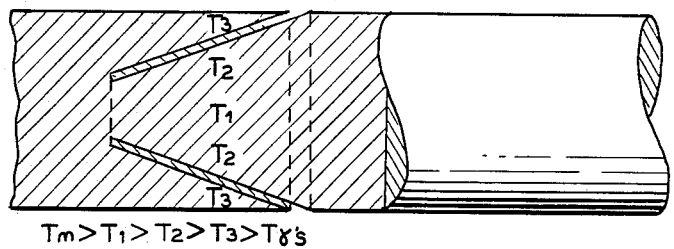
FIG. 5 shows in section the heat flow pattern as employable during zone annealing in accordance with the present invention.

An alternative is depicted in FIG. 4. FIG. 4 shows surfaces 18 and 19 on preform 11 which have been formed by removing all the material external to cut 16. Preform 11, as shown in FIG. 4, is zone annealed in a particular fashion as will be discussed hereinafter. The heat profile across the section of preform 11 which is advantageously used during zone annealing is depicted in FIG. 5. In the legend under FIG. 5 it is indicated that the temperature of alloy melting is higher than the annealing temperature in the center of preform 11 which in turn is higher than the temperature at a point somewhat external of the center of preform 11 and still higher than the surface temperature of preform 11 during zone annealing. All of these temperatures TM, T1, T2, T3 are higher than the solvus temperature of gamma prime phase in the oxide dispersion strengthened gamma prime phase hardened alloys which are particularly adapted to be employed in the process of the present invention. This heating profile tends to prevent spurious grain nucleation and/or growth elsewhere.

Figure 6:
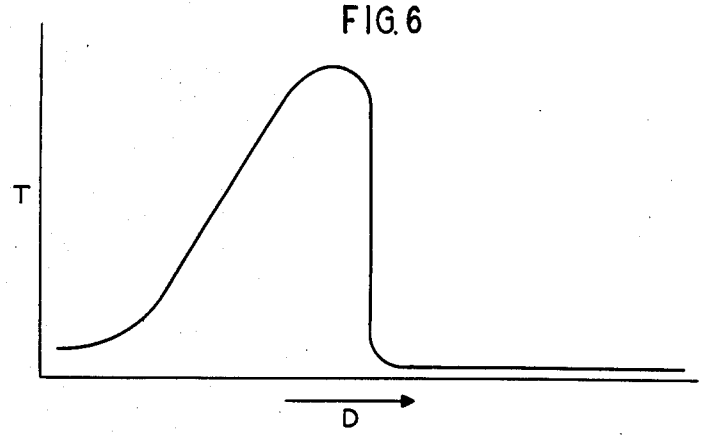
FIG. 6 shows an energy pattern pertinent to a steep gradient thermal energy source employable in the process of the present invention.

FIG. 6 shows schematically the temperature profile that exists at a particular point where zone annealing is taking place. Critical to FIG. 6 is the sharp drop in temperature giving a very steep temperature profile in front of the advancing annealing zone. It is to be understood that when one speaks of an advancing annealing zone the zone itself may be stationary with the preform moving or alternatively the zone can move and the preform remain stationary. It is also possible for both the zone and the preform to move in opposite directions but this generally complicates the zone annealing more than is necessary.

Referring back to FIG. 3, zone annealing of the preform 11 depicted in FIG. 3 is generally carried out with a relatively low frequency, directly coupled induction heating unit so designed to provide the thermal configuration as shown in FIG. 6. The filling 16 enables the preform 11 to be heated substantially completely therethrough by the low frequency inductor field which is designed specifically to give the steep temperature gradient as depicted in FIG. 6. In order to attain the thermal profile across the section of preform 11 as depicted in FIG. 5, one can pass cool gas, e.g., argon across the surface of the preform depicted in FIG. 3 so that exterior surface 20 loses heat to the cooling medium. Alternatively, using a low frequency induction heating source, it is possible to eliminate filling 16 (or employ a high resistivity filling 16) and cause an auxiliary electric current to flow along the length of preform 11. This results in additional heating at the narrowest point of the metal left by cut 16 i.e., the single crystal which has been isolated by the cut. While it is possible to employ a high frequency, directly coupled induction heat source for zone annealing it is not advantageous to do so because the higher the frequency of the induction heater, the more one tends to get a skin effect heating of the object in which the current is being induced and such skin effect is the exact opposite of the temperature profile which is desired for purposes of the present invention. If desired, a high frequency (or a low frequency) induction heating source can be indirectly coupled through a susceptor to the preform. The preform is thus heated by radiation from the susceptor. When using a preform such as depicted in FIG. 4 the relative motion of the zone annealing is from left to right. When the hot zone is at the left of preform 11 one adjusts the energy entering directly to preform 11 through an induction coil so as to compensate for the reduced section on the left hand side of preform 11. As the zone progresses toward the right the energy induced in the preform is gradually increased until a maximum is induced at and along the length of preform 11 which is of substantially uniform cross-sectional area. The means by which preform 11 is caused to have a higher temperature in the central portion of the preform as discussed with respect to FIG. 3, are the same with respect to the embodiment of FIG. 4.

EXAMPLE

In carrying out the process of the invention one forms a bar type preform made of an alloy containing in weight percent about 6-8% total aluminum plus titanium, up to about 6% tantalum up to about 3% niobium, about 10 to about 25% chromium, up to about 15% molybdenum, up to about 9% tungsten, up to about 15% cobalt, up to about 4% rhenium, up to about 0.2% carbon, up to about 0.15% zirconium, up to 0.03% boron up, to about 2% hafnium, up to about 1% yttrium, up to about 2% vanadium, about 0.2 to about 2% of an oxidic form of yttrium, balance essentially nickel. A suitable alloy made by mechanical alloying technique contains nominally:

| % by Wt. | Ingredient | % by Wt. | Ingredient |
| --- | --- | --- | --- |
| 4.5 | Al | 4.0 | W |
| 2.5 | Ti | 0.05 | C |
| 2.0 | Ta | 0.15 | Zr |
| 15.0 | Cr | 0.01 | B |
| 2.0 | Mo | 1.1 | $Y_2O_3$ |

This alloy, with or without boron or zirconium, is fashioned into a rectangular bar or plate. The thermomechanical history of the bar is such that it possesses a fine, polycrystalline grain structure adapted to be recrystallized. The bar is then subjected to zone annealing at a temperature in the range of 1200° to 1300° C., i.e., greater than or about equal to 40° in centigrade units above the gamma prime solvus temperature of this alloy to provide a columnar crystalline structure for at least about 1 cm from one end of the bar. This turns the bar into a preform as in 11 in FIG. 1 of the drawing. This zone annealing is carried out by means of an approximately rectangular shaped induction coil energized from a power source producing electric current at a frequency that is, in general, low (e.g., 10–50 K Hz) and particular is compatible with the bar size to give optimum through heating. The coil comprises approximately 1 to 5 turns over a length that is generally less than three times the thickness of the bar and is capable of inducing in the bar highly localized energy preferably at the center, over a bar length of approximately 1 to 2 cm. Relative motion between the coil and the bar is at a rate of approximately 1 to 8 cm/hr. After the columnarly-crystal-grained discard portion of the preform is established, the preform is examined, preferably by X-ray technique, to select a centrally located grain suitable for epitaxial growth. Once this grain is selected, the preform is cut at an angle of at least 135° (measured from the cut edge on each side to the longitudinal axis of the selected grain) to isolate that grain as the single connective between the discard end of the preform and the single crystal product end. The cut is then filled with a mixture of nickel-chromium alloy powder and graphite. After the cut is filled the thus prepared preform is then further zone annealed at a slightly higher energy input compared to that employed in the first zone annealing while at the same time the surface at that part of the preform being zone annealed is cooled by flowing cool inert argon across that hot surface. By these means a single crystal is grown in the product end of the preform by epitaxial growth on the isolated seed crystal. The angle of cut combined with the gradient of temperature from the center to the surface of the zone being annealed is important in minimizing nucleation of crystallization along the surface of the cut in competition with epitaxial growth on the isolated seed crystal. Once zone annealing is complete, the discard end of the preform is cut off e.g., by electric discharge machining leaving the single crystal product.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

I claim:

1. A process for producing a single crystal metallic object comprising establishing in a metallic object preform, having an object portion and discard portion, a coarsely columnar crystalline structure in said discard portion and a recrystallizable polycrystalline structure in said object portion, the longitudinal axes of the columnar crystals of said coarsely columnar crystal structure lying in a direction from said discard portion toward said object portion, cutting said preform to establish a relatively centrally-located one of said columnar crystals of suitable orientation as the sole continuous metallic connection between said object portion and said discard portion, the angle of cut being at least about 135° measured with reference to the axis of said one columnar crystal from the discard portion, thereafter zone annealing said cut object preform the epitaxially grow said one columnar crystal into said object portion at the expense of the crystals of said recrystallizable polycrystalline structure, said zone annealing being characterized by relative motion between said object preform and a localized, steep gradient thermal energy source so controlled and modified as to at least for an initial portion of said zone annealing, provide a higher annealing temperature at or near the location of said growing single columnar crystal than at the exterior of said preform and discarding said discard portion of said preform to thereby provide a single crystal metallic object of controlled crystallographic orientation.

2. A process as in claim 1 wherein said metallic object preform is a bar.

3. A process as in claim 1 wherein said metallic object is made of a dispersion hardened metal.

4. A process as in claim 3 wherein said dispersion hardened metal is an oxide dispersion hardened nickel-base alloy containing a gamma prime dispersed phase at a temperature below the gamma prime solvus temperature of said nickel-base alloy.

5. A process as in claim 4 wherein zone annealing is carried out at temperatures within the range of below the melting point of said nickel-base alloy and above the gamma prime solvus temperature of said nickel-base alloy.

* * * * *